United States Patent
Grandusky et al.

(10) Patent No.: US 9,620,676 B2
(45) Date of Patent: *Apr. 11, 2017

(54) PSEUDOMORPHIC ELECTRONIC AND OPTOELECTRONIC DEVICES HAVING PLANAR CONTACTS

(71) Applicants: James R. Grandusky, Waterford, NY (US); Leo J. Schowalter, Latham, NY (US); Muhammad Jamil, Watervliet, NY (US); Mark C. Mendrick, Albany, NY (US); Shawn R. Gibb, Clifton Park, NY (US)

(72) Inventors: James R. Grandusky, Waterford, NY (US); Leo J. Schowalter, Latham, NY (US); Muhammad Jamil, Watervliet, NY (US); Mark C. Mendrick, Albany, NY (US); Shawn R. Gibb, Clifton Park, NY (US)

(73) Assignee: CRYSTAL IS, INC., Green Island, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/046,515

(22) Filed: Feb. 18, 2016

(65) Prior Publication Data
US 2016/0225949 A1    Aug. 4, 2016

Related U.S. Application Data

(63) Continuation of application No. 14/208,379, filed on Mar. 13, 2014, now Pat. No. 9,299,880.
(Continued)

(51) Int. Cl.
*H01L 33/00* (2010.01)
*H01L 33/06* (2010.01)
*H01L 33/12* (2010.01)
*H01L 33/32* (2010.01)
*H01L 33/40* (2010.01)
*H01L 33/46* (2010.01)
(Continued)

(52) U.S. Cl.
CPC .......... *H01L 33/12* (2013.01); *H01L 33/0075* (2013.01); *H01L 33/06* (2013.01); *H01L 33/14* (2013.01); *H01L 33/22* (2013.01); *H01L 33/32* (2013.01); *H01L 33/325* (2013.01); *H01L 33/40* (2013.01); *H01L 33/405* (2013.01); *H01L 33/46* (2013.01); *H01L 33/04* (2013.01); *H01L 33/387* (2013.01); *H01L 33/42* (2013.01); *H01L 2933/0016* (2013.01); *H01L 2933/0025* (2013.01)

(58) Field of Classification Search
CPC ........................... H01L 33/0075; H01L 33/06
See application file for complete search history.

(56) References Cited

U.S. PATENT DOCUMENTS

| | | | |
|---|---|---|---|
| 6,618,413 B2 * | 9/2003 | Bour | B82Y 20/00 372/45.01 |
| 9,299,880 B2 * | 3/2016 | Grandusky | H01L 33/14 |

(Continued)

*Primary Examiner* — Jarrett Stark
*Assistant Examiner* — Charles N Ausar-El
(74) *Attorney, Agent, or Firm* — Morgan, Lewis & Bockius LLP

(57) ABSTRACT

In various embodiments, light-emitting devices incorporate smooth contact layers and polarization doping (i.e., underlying layers substantially free of dopant impurities) and exhibit high photon extraction efficiencies.

29 Claims, 5 Drawing Sheets

Related U.S. Application Data

(60) Provisional application No. 61/788,141, filed on Mar. 15, 2013.

(51) Int. Cl.
 *H01L 33/14* (2010.01)
 *H01L 33/22* (2010.01)
 H01L 33/04 (2010.01)
 H01L 33/38 (2010.01)
 H01L 33/42 (2010.01)

(56) References Cited

U.S. PATENT DOCUMENTS

| | | | | |
|---|---|---|---|---|
| 2006/0046328 | A1* | 3/2006 | Raffetto | H01L 33/40 438/21 |
| 2007/0101932 | A1* | 5/2007 | Schowalter | C30B 11/003 117/84 |
| 2008/0187016 | A1* | 8/2008 | Schowalter | H01L 21/02389 372/45.011 |
| 2009/0283028 | A1* | 11/2009 | Schowalter | H01L 21/02389 117/9 |
| 2010/0133508 | A1* | 6/2010 | Bergmann | H01L 21/0237 257/13 |
| 2010/0264460 | A1* | 10/2010 | Grandusky | H01L 21/02389 257/190 |
| 2011/0024722 | A1* | 2/2011 | Moustakas | H01L 21/02378 257/13 |
| 2011/0156048 | A1* | 6/2011 | Yokogawa | H01L 33/32 257/76 |
| 2011/0235665 | A1* | 9/2011 | Simon | H01L 21/02389 372/44.011 |
| 2012/0146047 | A1* | 6/2012 | Kneissl | H01L 33/46 257/76 |

* cited by examiner

PSEUDOMORPHIC ELECTRONIC AND OPTOELECTRONIC DEVICES HAVING PLANAR CONTACTS

RELATED APPLICATIONS

This application is a continuation of U.S. patent application Ser. No. 14/208,379, filed Mar. 13, 2014, which claims the benefit of and priority to U.S. Provisional Patent Application No. 61/788,141, filed Mar. 15, 2013, the entire disclosure of each of which is hereby incorporated herein by reference.

GOVERNMENT SUPPORT

This invention was made with United States Government support under contract W911NF-09-2-0068 with the United States Army. The United States Government has certain rights in the invention.

TECHNICAL FIELD

In various embodiments, the present invention relates to improving carrier injection efficiency (e.g., the hole injection efficiency) into high-aluminum-content electronic and optoelectronic devices. Embodiments of the present invention also relate to improving ultraviolet optoelectronic devices fabricated on nitride-based substrates, in particular to improving light extraction therefrom.

BACKGROUND

The output powers, efficiencies, and lifetimes of short-wavelength ultraviolet light-emitting diodes (UV LEDs)—i.e., LEDs that emit light at wavelengths less than 350 nm—based on the nitride semiconductor system remain limited due to high defect levels in the active region. These limitations are particularly problematic (and notable) in devices designed to emit at wavelengths less than 280 nm. Particularly in the case of devices formed on foreign substrates, such as sapphire, defect densities remain high despite significant efforts to reduce them. These high defect densities limit both the efficiency and the reliability of devices grown on such substrates.

The recent introduction of low-defect, crystalline aluminum nitride (AlN) substrates has the potential to dramatically improve nitride-based optoelectronic semiconductor devices, particularly those having high aluminum concentration, due to the benefits of having lower defects in the active regions of these devices. For example, UV LEDs pseudomorphically grown on AlN substrates have been demonstrated to have higher efficiencies, higher power, and longer lifetimes compared to similar devices formed on other substrates. Generally, these pseudomorphic UV LEDs are mounted for packaging in a "flip-chip" configuration, where the light generated in the active region of the device is emitted through the AlN substrate, while the LED dies have their front surfaces (i.e., the top surfaces of the devices during epitaxial growth and initial device fabrication prior to bonding) bonded to a patterned submount which is used to make electrical and thermal contact to the LED chip. A good submount material is polycrystalline (ceramic) AlN because of the relatively good thermal expansion match with the AlN chip and because of the high thermal conductivity of this material. Due to the high crystalline perfection that is achievable in the active device region of such devices, internal efficiencies greater than 60% have been demonstrated.

Unfortunately, the photon-extraction efficiency is often still very poor in these devices, ranging from about 4% to about 15% achieved using surface-patterning techniques—much lower than exhibited by many visible-light (or "visible") LEDs. Thus, the current generation of short-wavelength UV LEDs has low wall-plug efficiencies (WPEs) of, at best, only a few percent, where the WPE is defined as the ratio of usable optical power (in this case, emitted UV light) achieved from the diode to the electrical power supplied into the device. The WPE of an LED may be calculated by taking the product of the electrical efficiency ($\eta_{el}$), the photon extraction efficiency ($\eta_{ex}$), and the internal efficiency (IE); i.e., WPE=$\eta_{el}\times\eta_{ex}\times$IE. The IE itself is the product of current injection efficiency ($\eta_{inj}$) and the internal quantum efficiency (IQE); i.e., IE=$\eta_{inj}\times$IQE. Thus, a low $\eta_{ex}$ will deleteriously impact the WPE even after the IE has been improved via the reduction of internal crystalline defects enabled by, e.g., the use of the AlN substrates referenced above as platforms for the devices.

There are several possible contributors to low photon-extraction efficiency. For example, currently available AlN substrates generally have some absorption in the UV wavelength range, even at wavelengths longer than the band edge in AlN (which is approximately 210 nm). This absorption tends to result in some of the UV light generated in the active area of the device being absorbed in the substrate, hence diminishing the amount of light emitted from the substrate surface. However, this loss mechanism may be mitigated by thinning the AlN as described in U.S. Pat. No. 8,080,833 ("the '833 patent," the entire disclosure of which is incorporated by reference herein) and/or by reducing the absorption in the AlN substrate as described in U.S. Pat. No. 8,012,257 (the entire disclosure of which is incorporated by reference herein). Additionally, UV LEDs typically suffer because approximately 50% of the generated photons are directed toward the p-contact, which typically includes photon-absorbing p-GaN. Even when photons are directed toward the AlN surface, only about 9.4% typically escape from an untreated surface due to the large index of refraction of the AlN, which results in a small escape cone. These losses are multiplicative and the average photon extraction efficiency may be quite low.

As demonstrated in a recent publication by Grandusky et al. (James R. Grandusky et al., 2013 Appl. Phys. Express, Vol. 6, No. 3, 032101, hereinafter referred to as "Grandusky 2013," the entire disclosure of which is incorporated by reference herein), it is possible to increase the photon extraction efficiency to approximately 15% in pseudomorphic UV LEDs grown on AlN substrates via the attachment of an inorganic (and typically rigid) lens directly to the LED die via a thin layer of an encapsulant (e.g., an organic, UV-resistant encapsulant compound). This encapsulation approach, which is also detailed in U.S. patent application Ser. No. 13/553,093, filed on Jul. 19, 2012 ("the '093 application," the entire disclosure of which is incorporated by reference herein), increases the critical angle of total internal reflection through the top surface of the semiconductor die, which significantly improves photon-extraction efficiency for the UV LEDs. In addition, and as mentioned above, the photon extraction efficiency may be increased by thinning the AlN substrate and by roughening the surface of the AlN substrate surface as discussed in the '833 patent.

Unfortunately, none of these efforts addresses the major loss of photons due to absorption in the p-GaN utilized for the p-contact to these devices. In the type of pseudomorphic UV device described by Grandusky 2013, p-GaN is used to make the p-contact to the LED because it allows a relatively low resistance contact to be made to the p-side of the device. However, the band gap energy of GaN is only 3.4 eV, and thus it is highly absorbing to photons with wavelengths shorter than 365 nm. Since typically 50% of the photons generated are directed toward the p-contact, these photons are typically immediately lost due to absorption in the p-GaN. In addition, even photons directed toward the emission surface of the diode will typically only have a single chance to escape since, if they are reflected back into the diode, they will likely be absorbed by the p-GaN. The p-GaN is utilized conventionally because it is very difficult to make a low-resistivity contact to p-$Al_xGa_{1-x}N$ where x is greater than 0.3. In addition, metals that allow low-resistivity contact to the p-type nitride semiconductor material are generally poor reflectors. This reflectivity problem is particularly exacerbated when the desired wavelength of the LED is less than 340 nm since most common metals will start to absorb strongly in that regime.

In addition, prior work has suggested using a thick p-GaN layer (or p-$Al_xGa_{1-x}N$ layer with x<0.2) so that the hole current spreads sufficiently from and beneath the p-metal contacts. This approach generally will not work for devices emitting light of wavelengths shorter than 300 nm because of the high absorption of the p-GaN or p-$Al_xGa_{1-x}N$ material at these shorter wavelengths.

Alternatively, the above-referenced shortcomings might be remedied via the use of a non-absorbing p-type semiconductor on the p-side of the LED and the use of p-contact metallurgy that reflects the UV photons. However, conventional approaches are unsuited to pseudomorphic UV LEDs since these approaches use multiple layers of thin p-$Al_xGa_{1-x}N$ where the p-type $Al_xGa_{1-x}N$ layers are thin enough to be optically transparent to the UV radiation at wavelengths shorter than 300 nm. This type of multi-layer structure is very difficult to grow on a pseudomorphic device structure (where the underlying substrate is either AlN or $Al_xGa_{10x}N$ with x>0.6), because the large amount of strain (due to the lattice mismatch) typically causes the thin GaN (or low aluminum content $Al_xGa_{1-x}N$) to island and become very rough. In the Grandusky 2013 paper, contact roughening is addressed by making the p-type GaN layer quite thick; however, such layers, as detailed above, absorb UV photons and diminish UV LED device efficiencies.

Therefore, in view of the foregoing, there is a need for improved contact metallurgy and performance for UV LEDs, particularly those UV LEDs produced on AlN substrates, in order to improve characteristics, such as the WPE, of such devices.

SUMMARY

In various embodiments of the present invention, a smooth p-GaN (or p-$Al_xGa_{1-x}N$ layer where x<0.3) layer is produced on the active region (e.g., a pseudomorphic active region) of an electronic or optoelectronic device grown on a single-crystal AlN substrate or single-crystal $Al_xGa_{1-x}N$ substrate where x>0.6. This smooth p-GaN or p-$Al_xGa_{1-x}N$ layer where x<0.3 will hereinafter be abbreviated as the SPG layer. The SPG layer is very desirable for improved fabrication of any pseudomorphic electronic or optoelectronic device utilizing a p-contact because it minimizes or substantially eliminates the rough surfaces that are difficult to etch and metallize uniformly. In various embodiments of the present invention, the SPG layer may also be made sufficiently thin to be transparent to UV radiation having wavelengths shorter than 340 nm. The thin, UV-transparent SPG layer may be combined with a reflective metal contact to the SPG layer, and this bilayer structure may then be used to both efficiently inject holes into a UV optoelectronic device and reflect UV photons from the p-contact. In various embodiments of the present invention, the thin, UV-transparent SPG layer, when combined with an appropriately designed UV reflective contact, will allow a pseudomorphic UV LED to be fabricated on an AlN (or $Al_xGa_{1-x}N$ substrate with x>0.6) substrate with a photon extraction efficiency greater than 25%. The thin SPG layer on a pseudomorphic UV LED may be combined with a reflector metal contact to achieve a WPE greater than 10% at wavelengths shorter than 275 nm at current densities exceeding 30 $A/cm^{-2}$.

In further embodiments of the present invention, a first metal layer capable of making a low-resistivity contact to the SPG layer is disposed on the SPG layer and patterned. The resulting gaps in the first metal layer may then be filled via the deposition of a second metal layer that is an efficient reflector of UV photons. In this manner, the two-metal structure provides the dual advantages of low contact resistance and high reflectivity, both of which improve the performance of UV LEDs.

In an exemplary embodiment, Al may be used as the reflector metal, as it has >90% reflectivity to light having a wavelength of approximately 265 nm. However, Al is quite poor for making a low-resistivity contact to p-type GaN or p-type $Al_xGa_{1-x}N$ because of its low work function (4.26 eV). The high resistivity of the Al/nitride interface is addressed by the regions of the low-resistivity contact metal; however, in order to prevent absorption of the UV photons by the contact metal, preferred embodiments of the invention utilize only limited contact areas between the contact metal and the underlying semiconductor rather than a contact metal-semiconductor contact area covering substantially all of the semiconductor surface. For example, in some embodiments (i) more than about 10% of the semiconductor surface is covered by the contact metal, but (ii) less than about 70%, less than about 60%, less than about 50%, or even less than 40% of the semiconductor surface is covered by the contact metal, while the remaining portion of the semiconductor surface is covered by the reflector metal to minimize deleterious absorption of the UV light.

In one aspect, embodiments of the invention feature a method of forming a contact to a UV light-emitting device. A substrate having an $Al_yGa_{1-y}N$ top surface is provided, where y≥0.4 (and ≤1.0). The substrate may be substantially entirely composed of the $Al_yGa_{1-y}N$ material (e.g., AlN), or the substrate may include or consist essentially of a different material (e.g., silicon carbide, silicon, and/or sapphire) with the $Al_yGa_{1-y}N$ material formed thereover by e.g., epitaxial growth; such material may be substantially fully lattice relaxed and may have a thickness of, e.g., at least 1 μm. An active, light-emitting device structure is formed over the substrate, the device structure including or consisting essentially of a plurality of layers each including or consisting essentially of $Al_xGa_{1-x}N$. An undoped graded $Al_{1-z}Ga_zN$ layer is formed over the device structure, a composition of the graded layer being graded in Ga concentration z such that the Ga concentration z increases in a direction away from the light-emitting device structure. (For example, the Ga concentration z may increase from a composition of approximately 0.15 proximate the device structure to a composition of approximately 1 at the top of the graded layer.) A p-doped $Al_{1-w}Ga_wN$ cap layer is formed over the graded layer, the cap layer (i) having a thickness between approximately 2 nm and approximately 30 nm, (ii) a surface roughness of less than approximately 6 nm over a sample size of approximately 200 μm×300 μm, and (iii) a Ga concentration w≥0.8. A metallic contact comprising at least one metal is formed over the $Al_{1-w}Ga_wN$ cap layer, the metallic contact having a contact resistivity to the $Al_{1-w}Ga_wN$ cap layer of less than approximately 1.0 mΩ-cm².

Embodiments of the invention may include one or more of the following in any of a variety of combinations. Forming the $Al_{1-w}Ga_wN$ cap layer may include or consist essentially of epitaxial growth at a temperature between 850° C. and 900° C. and a growth pressure less than 50 Torr, e.g., between approximately 10 Torr and approximately 30 Torr, for example 20 Torr. The $Al_{1-w}Ga_wN$ cap layer may be doped with Mg and/or may be at least partially relaxed. The light-emitting device may have a photon extraction efficiency of greater than 25%. The graded layer and $Al_{1-w}Ga_wN$ cap layer may collectively absorb less than 80% of UV photons generated by the light-emitting device structure and having a wavelength less than 340 nm. The at least one metal of the metallic contact may include or consist essentially of Ni/Au and/or Pd. The metallic contact may have a reflectivity to light generated by the light-emitting device structure of approximately 60% or less, or even approximately 30% or less. The metallic contact may be formed as a plurality of discrete lines and/or pixels of the at least one metal, portions of the $Al_{1-w}Ga_wN$ cap layer not being covered by the metallic contact. A reflector may be formed over the metallic contact and the uncovered portions of the $Al_{1-w}Ga_wN$ cap layer. The reflector may include or consist essentially of a metal having greater than 60%, or even greater than 90%, reflectivity to UV light and a work function less than approximately 4.5 eV. The reflector may have a contact resistivity to the $Al_{1-w}Ga_wN$ cap layer of greater than approximately 5 mΩ-cm², or even greater than approximately 10 mΩ-cm². The reflector may include or consist essentially of Al.

The light-emitting device may include or consist essentially of a light-emitting diode or a laser. A bottom portion of the graded layer proximate the active device structure may have a Ga concentration z substantially equal to a Ga concentration of a layer directly thereunder, and/or a top portion of the graded layer opposite the bottom portion of the graded layer may have a Ga concentration z of approximately 1. Forming the $Al_{1-w}Ga_wN$ cap layer may include or consist essentially of epitaxial growth at a growth rate between 0.5 nm/min and 5 nm/min. Between forming the graded layer and forming the $Al_{1-w}Ga_wN$ cap layer, a surface of the graded layer may be exposed to a precursor of the p-type dopant of the cap layer without exposure to a Ga precursor. The p-type dopant of the cap layer may include or consist essentially of Mg. The substrate may consist essentially of doped or undoped AlN.

In another aspect, embodiments of the invention feature a UV light-emitting device including or consisting essentially of a substrate having an $Al_yGa_{1-y}N$ top surface, where y≥0.4 (and ≤1.0), a light-emitting device structure disposed over the substrate, the device structure including or consisting essentially of a plurality of layers each including or consisting essentially of $Al_xGa_{1-x}N$, an undoped graded $Al_{1-z}Ga_zN$ layer disposed over the device structure, a composition of the graded layer being graded in Ga concentration z such that the Ga concentration z increases in a direction away from the light-emitting device structure, a p-doped $Al_{1-w}Ga_wN$ cap layer disposed over the graded layer, the p-doped $Al_{1-w}Ga_wN$ cap layer (i) having a thickness between approximately 2 nm and approximately 30 nm, (ii) a surface roughness of less than approximately 6 nm over a sample size of approximately 200 μm×300 μm, and (iii) a Ga concentration w≥0.8, and a metallic contact disposed over the $Al_{1-w}Ga_wN$ cap layer and including or consisting essentially of at least one metal, the metallic contact having a contact resistivity to the $Al_{1-w}Ga_wN$ cap layer of less than approximately 1.0 mΩ-cm². The substrate may be substantially entirely composed of the $Al_yGa_{1-y}N$ material (e.g., AlN), or the substrate may include or consist essentially of a different material (e.g., silicon carbide, silicon, and/or sapphire) with the $Al_yGa_{1-y}N$ material formed thereover by e.g., epitaxial growth; such material may be substantially fully lattice relaxed and may have a thickness of, e.g., at least 1 μm.

Embodiments of the invention may include one or more of the following in any of a variety of combinations. The $Al_{1-w}Ga_wN$ cap layer may be doped with Mg and/or may be at least partially relaxed. The light-emitting device may have a photon extraction efficiency of greater than 25%. The graded layer and $Al_{1-w}Ga_wN$ cap layer may collectively absorb less than 80% of UV photons generated by the light-emitting device structure and having a wavelength less than 340 nm. The at least one metal of the metallic contact may include or consist essentially of Ni/Au and/or Pd. The metallic contact may have a reflectivity to light generated by the light-emitting device structure of approximately 60% or less, or even approximately 30% or less.

The metallic contact may have the form of a plurality of discrete lines and/or pixels of the at least one metal, portions of the $Al_{1-w}Ga_wN$ cap layer not being covered by the metallic contact. A reflector may be disposed over the metallic contact and the uncovered portions of the $Al_{1-w}Ga_wN$ cap layer. The reflector may include or consist essentially of a metal having greater than 60%, or even greater than 90%, reflectivity to UV light and a work function less than approximately 4.5 eV. The reflector may have a contact resistivity to the $Al_{1-w}Ga_wN$ cap layer of greater than approximately 5 mΩ-cm², or even greater than approximately 10 mΩ-cm². The reflector may include or consist essentially of Al. The light-emitting device may include or consist essentially of a light-emitting diode or a laser. A bottom portion of the graded layer proximate the active device structure may have a Ga concentration z substantially equal to a Ga concentration of a layer directly thereunder, and/or a top portion of the graded layer opposite the bottom portion of the graded layer may have a Ga concentration z of approximately 1. The substrate may consist essentially of doped or undoped AlN.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
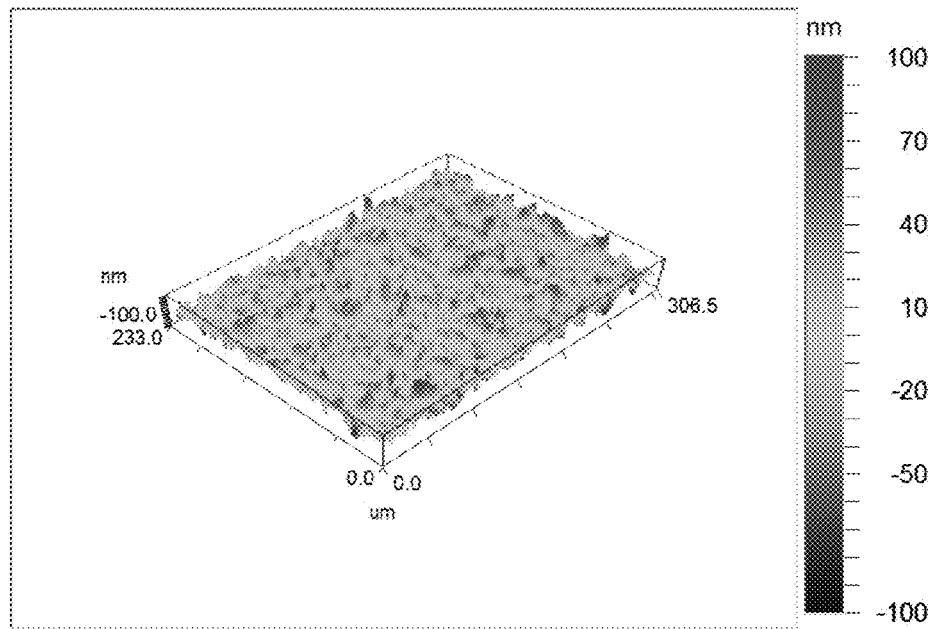
FIG. 1 is an optical profilometry surface-roughness scan of a conventional contact layer for an LED device.
Figure 2:
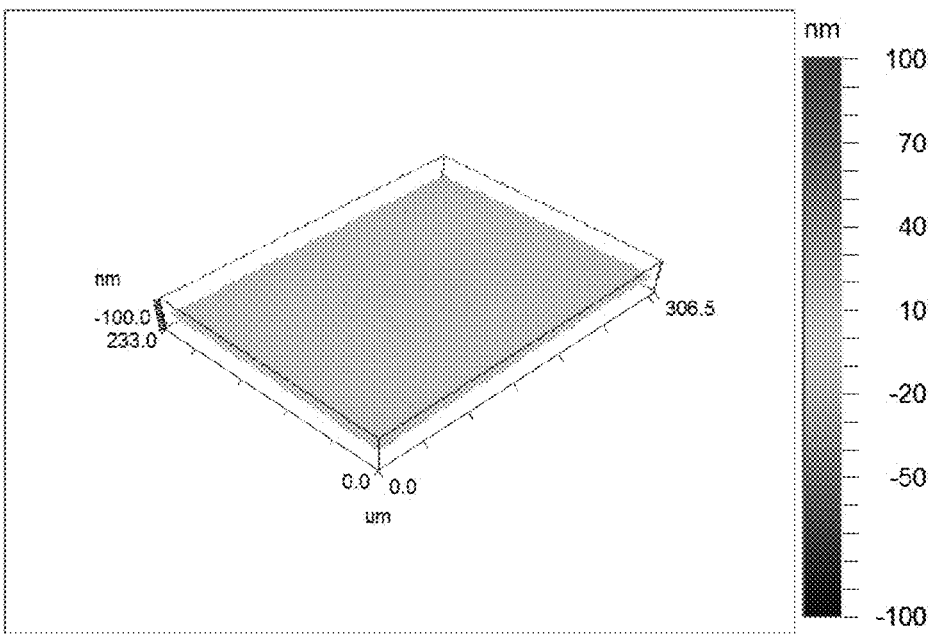
FIG. 2 is an optical profilometry surface-roughness scan of a contact layer for a light-emitting device in accordance with various embodiments of the invention.

Embodiments of the invention include pseudomorphic $Al_xGa_{1-x}N$ electronic and light-emitting devices on a substrate having an $Al_yGa_{1-y}N$ top surface, where $y \geq 0.4$ (and $\leq 1.0$). The substrate may be substantially entirely composed of the $Al_yGa_{1-y}N$ material (e.g., AlN), or the substrate may include or consist essentially of a different material (e.g., silicon carbide, silicon, and/or sapphire) with the $Al_yGa_{1-y}N$ material formed thereover by e.g., epitaxial growth; such material may be substantially fully lattice relaxed and may have a thickness of, e.g., at least 1 µm. (Although light-emitting devices in accordance with preferred embodiments of the present invention are configured for the emission of UV light, the substrate need not be transparent to UV radiation (e.g., silicon), since it may be partially or substantially removed during device fabrication.) The devices according to embodiments of the invention also have a thin p-GaN or p-$Al_xGa_{1-x}N$ contact layer that is smooth (i.e., having a root-mean-square (Rq) surface roughness of less than approximately 6 nm, or even less than approximately 1 nm). The roughness may characterized with optical profilometry over a sample size of approximately 200 µm×300 µm, e.g., 233 µm×306.5 µm. FIG. 1 depicts a profilometry scan of a conventional rough contact-layer surface having an Rq value of approximately 33 nm. In contrast, FIG. 2 depicts a smooth contact surface in accordance with embodiments of the present invention that has an Rq value of only approximately 6 nm.

In preferred embodiments of the invention, the threading dislocation density (TDD) in the active region of the device is less than $10^5$ cm$^{-2}$. Furthermore, in preferred embodiments, the thin p-GaN or p-$Al_xGa_{1-x}N$ (SPG) final layer will be sufficiently thin to allow light with wavelengths shorter than 340 nm to be transmitted with minimal absorption (i.e., absorption in a single pass no greater than 80%, no greater than 50%, or even no greater than 40%). By decreasing the thickness of the SPG layer or by increasing the concentration of Al in a given thickness for the SPG layer, the UV absorption at wavelengths shorter than 340 nm may be decreased to 50%, to 25%, to 10%, or even to 5% or less. For example, for a UV LED designed to operate at 265 nm, the absorption coefficient of this radiation in the p-GaN layer will be approximately $1.8 \times 10^5$ cm$^{-1}$. Table 1 illustrates various thickness-absorption relationships for $Al_xGa_{1-x}N$ layers of various Al contents x and thicknesses for a variety of emission wavelengths. In Table 1, absorption values are shown for layers of 40% Al only for emission wavelengths up to 265 nm, as such layers become substantially transparent at larger wavelengths.

TABLE 1

| Al % in AlGaN | Emission wavelength (nm) | % absorbed (single pass) thickness (microns) | | | | | | | |
|---|---|---|---|---|---|---|---|---|---|
| | | 0.001 | 0.002 | 0.003 | 0.01 | 0.025 | 0.05 | 0.1 | 0.2 |
| 0 | 235 | 2.5% | 4.9% | 7.2% | 22.1% | 46.5% | 71.3% | 91.8% | 99.3% |
| 0 | 250 | 2.1% | 4.1% | 6.1% | 18.9% | 40.8% | 65.0% | 87.8% | 98.5% |
| 0 | 265 | 1.7% | 3.4% | 5.1% | 16.1% | 35.4% | 58.3% | 82.6% | 97.0% |
| 0 | 280 | 1.6% | 3.1% | 4.7% | 14.8% | 33.0% | 55.1% | 79.8% | 95.9% |
| 0 | 305 | 1.3% | 2.6% | 3.8% | 12.2% | 27.7% | 47.8% | 72.7% | 92.6% |
| 20 | 235 | 1.8% | 3.6% | 5.4% | 16.9% | 37.0% | 60.3% | 84.3% | 97.5% |
| 20 | 250 | 1.6% | 3.1% | 4.7% | 14.8% | 33.0% | 55.1% | 79.8% | 95.9% |
| 20 | 265 | 1.3% | 2.7% | 4.0% | 12.6% | 28.6% | 49.1% | 74.1% | 93.3% |
| 20 | 280 | 1.2% | 2.4% | 3.5% | 11.3% | 25.9% | 45.1% | 69.9% | 90.9% |
| 20 | 305 | 0.9% | 1.8% | 2.7% | 8.6% | 20.1% | 36.2% | 59.3% | 83.5% |
| 40 | 235 | 1.4% | 2.8% | 4.1% | 13.1% | 29.5% | 50.3% | 75.3% | 93.9% |
| 40 | 250 | 1.2% | 2.4% | 3.5% | 11.3% | 25.9% | 45.1% | 69.9% | 90.9% |
| 40 | 265 | 1.0% | 2.0% | 3.0% | 9.5% | 22.1% | 39.3% | 63.2% | 86.5% |

In order to improve the photon extraction efficiency and enable extraction of photons directed towards the p-type material, a UV reflector may be introduced into the device structure to reflect transmitted photons and direct them towards the Al substrate so that they may be extracted from the device. In visible LEDs, this is often accomplished by using a silver p-contact, as silver both forms an ohmic contact to visible-LED structures and is reflective to visible photons. In addition, the layers that form a visible LED are generally transparent to the photons being generated in the quantum wells. However, the reflectivity of silver drops rapidly in the UV range. The reflectivities of most other common metals also drop as the wavelength decreases into the UV range with the exception of Al, which unfortunately does not form a good ohmic contact to p-type GaN or $Al_xGa_{1-x}N$.

Thus, in order to reflect photons while still achieving good ohmic contact, a fairly non-reflective (at least to UV photons) contact metallurgy (e.g., Ni/Au or Pd) may be formed over the contact layer but patterned to reduce the surface "footprint" of the contact over the semiconductor. In this manner, the surface area over the device layers that is non-reflective to UV photons is minimized, yet good ohmic contact to the semiconductor is still achieved. In order to reflect at least a portion of the UV photons, a reflective metal such as Al may be provided directly over the semiconductor between the non-reflective contact regions. The reflective metal makes an ohmic contact with the non-reflective metal, enabling electrical contact to the LED while utilizing the superior metal-semiconductor contact formed by the non-reflective metal.

In such embodiments, the SPG layer may include or consist essentially of a p-GaN or p-$Al_xGa_{1-x}N$ layer where x<0.3. Typically, thicker SPG layers may be utilized as the Ga content is decreased, as the lattice-mismatch strain (that may roughen the SPG layer) between the SPG layer and the underlying AlN substrate decreases. However, the Ga content of the SPG layer is preferably maintained at or above 70% in order to enable a highly doped, low-resistivity layer.

For p-type $Al_xGa_{1-x}N$ layers doped with Mg, as the Al mole fraction (x) is increased, the activation energy of the Mg impurity is increased. This leads to lower activation of the Mg, resulting in lower hole concentration as the Al mole fraction is increased. One solution to this is to utilize polarization-induced doping, which may be achieved by the grading of an $Al_xGa_{1-x}N$ layer from high x to lower x as it is deposited. This may be used to achieve hole concentrations much higher than may be achieved through conventional impurity doping. In addition, this technique may result in improved carrier mobilities due to lack of impurity scattering and reduced temperature dependence of the hole concentration. High hole concentrations may be achieved in the absence of impurity doping or in addition to impurity doping. Preferred embodiments of the invention feature low dislocation density in pseudomorphic graded layers, which enables high hole concentration in the absence of impurity doping, thus allowing for higher conductivity and improved current spreading from thin transparent layers. These high hole concentrations make it possible to achieve p-contacts with low resistivity. In particular, resistivities less than 10 mΩ-$cm^2$ may be achieved in accordance with embodiments of the present invention. In preferred embodiments, resistivities less than 5 mΩ-$cm^2$ are achieved and utilized in UV LEDs. For contacts with resistivities of 10 mΩ-$cm^2$, the device may be operated at 30 A/$cm^2$ with a 1:3 ratio of contact metal to reflector metal (as detailed above) and achieve a voltage drop across the p-contact of less than 1.2 V with a device area of 0.0033 $cm^2$. By covering 75% of the p-contact area with good reflector metal and using an SPG layer with absorption less than 80%, it is possible to achieve photon extraction efficiencies in UV LEDs that are greater than 25%, particularly when combined with the efficient photon extraction techniques described above. When the high photon extraction efficiency of greater than 25% is combined with the low-resistivity contact described above, embodiments of the invention exhibit wall plug efficiencies greater than 10% at an operating current density exceeding 30 A/$cm^2$.

Figure 3A:
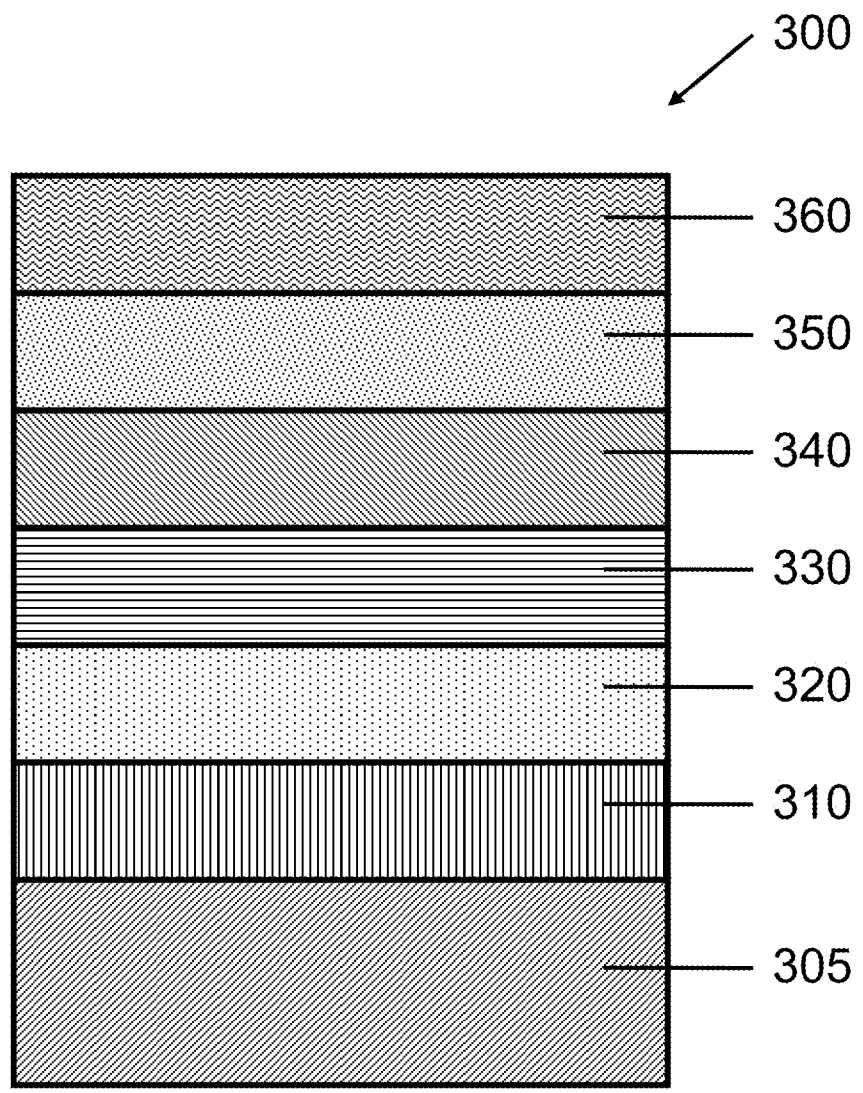
FIGS. 3A and 3B are schematic cross-sections of light-emitting devices in accordance with various embodiments of the invention.

FIG. 3A depicts a pseudomorphic UV light emitting diode ("PUVLED") structure 300 in accordance with embodiments of the present invention. A semiconductor substrate 305, which includes or consists essentially of, e.g., a substrate having an $Al_yGa_{1-y}N$ top surface, where y≥0.4 (and ≤1.0), is provided. The substrate may be substantially entirely composed of the $Al_yGa_{1-y}N$ material (e.g., AlN), or the substrate may include or consist essentially of a different material (e.g., silicon carbide, silicon, and/or sapphire) with the $Al_yGa_{1-y}N$ material formed thereover by e.g., epitaxial growth; such material may be substantially fully lattice relaxed and may have a thickness of, e.g., at least 1 µm. As mentioned above, the substrate 305 need not be transparent to UV radiation (e.g., silicon), since it may be partially or substantially removed during device fabrication. Semiconductor substrate 305 may be miscut such that the angle between its c-axis and its surface normal is between approximately 0° and approximately 4°. In a preferred embodiment, the misorientation of the surface of semiconductor substrate 305 is less than approximately 0.3°, e.g., for semiconductor substrates 305 that are not deliberately or controllably miscut. In other embodiments, the misorientation of the surface of semiconductor substrate 305 is greater than approximately 0.3°, e.g., for semiconductor substrates 305 that are deliberately and controllably miscut. In a preferred embodiment, the direction of the miscut is towards the a-axis. The surface of semiconductor substrate 305 may have a group-III (e.g., Al—) polarity or N-polarity, and may be planarized, e.g., by chemical-mechanical polishing. The RMS surface roughness of semiconductor substrate is preferably less than approximately 0.5 nm for a 10 µm×10 µm area. In some embodiments, atomic-level steps are detectable on the surface when probed with an atomic-force microscope. The threading dislocation density of semiconductor substrate 305 may be measured using, e.g., etch pit density measurements after a 5 minute KOH—NaOH eutectic etch at 450° C. Preferably the threading dislocation density is less than approximately 2×$10^3$ $cm^{-2}$. In some embodiments substrate 305 has an even lower threading dislocation density. Semiconductor substrate 305 may be topped with a homoepitaxial layer (not shown) that includes or consists essentially of the same semiconductor material present in semiconductor substrate 300, e.g., AlN.

In an embodiment, an optional graded buffer layer 310 is formed on semiconductor substrate 305. Graded buffer layer 310 may include or consist essentially of one or more semiconductor materials, e.g., $Al_xGa_{1-x}N$. In a preferred embodiment, graded buffer layer 310 has a composition approximately equal to that of semiconductor substrate 305 at an interface therewith in order to promote two-dimensional growth and avoid deleterious islanding (such islanding may result in undesired elastic strain relief and/or surface roughening in graded buffer layer 310 and subsequently grown layers). The composition of graded buffer layer 310 at an interface with subsequently grown layers (described below) is generally chosen to be close to (e.g., approximately equal to) that of the desired active region of the device (e.g., the $Al_xGa_{1-x}N$ concentration that will result in the desired wavelength emission from the PUVLED). In an embodiment, graded buffer layer 310 includes $Al_xGa_{1-x}N$ graded from an Al concentration x of approximately 100% to an Al concentration x of approximately 60%.

A bottom contact layer 320 is subsequently formed above substrate 305 and optional graded layer 310, and may include or consist essentially of $Al_xGa_{1-x}N$ doped with at least one impurity, e.g., Si. In an embodiment, the Al concentration x in bottom contact layer 320 is approximately equal to the final Al concentration x in graded layer 310 (i.e., approximately equal to that of the desired active region (described below) of the device). Bottom contact layer 320 may have a thickness sufficient to prevent current crowding after device fabrication (as described below) and/or to stop on during etching to fabricate contacts. For example, the thickness of bottom contact layer 320 may be less than approximately 200 nm. When utilizing a bottom contact layer 320 of such thickness, the final PUVLED may be fabricated with back-side contacts. In many embodiments, bottom contact layer 320 will have high electrical conductivity even with a small thickness due to the low defect density maintained when the layer is pseudomorphic. As utilized herein, a pseudomorphic film is one where the strain parallel to the interface is approximately that needed to distort the lattice in the film to match that of the substrate. Thus, the parallel strain in a pseudomorphic film will be nearly or approximately equal to the difference in lattice parameters between an unstrained substrate parallel to the interface and an unstrained epitaxial layer parallel to the interface.

A multiple-quantum well ("MQW") layer 330 is fabricated above bottom contact layer 320. MQW layer 330 corresponds to the "active region" of PUVLED structure 300 and includes a plurality of quantum wells, each of which may include or consist essentially of AlGaN. In an embodiment, each period of MQW layer 330 includes an $Al_xGa_{1-x}N$ quantum well and an $Al_yGa_{1-y}N$ barrier, where x is different from y. In a preferred embodiment, the difference between x and y is large enough to obtain good confinement of the electrons and holes in the active region, thus enabling high ratio of radiative recombination to non-radiative recombination. In an embodiment, the difference between x and y is approximately 0.05, e.g., x is approximately 0.35 and y is approximately 0.4. However, if the difference between x and y is too large, e.g., greater than approximately 0.3, deleterious islanding may occur during formation of MQW layer 330. MQW layer 330 may include a plurality of such periods, and may have a total thickness less than approximately 50 nm. Above MQW layer 330 may be formed an optional thin electron-blocking (or hole-blocking if the n-type contact is put on top of the device) layer 340, which includes or consists essentially of, e.g., $Al_xGa_{1-x}N$, which may be doped with one or more impurities such as Mg. Electron-blocking layer 340 has a thickness that may range between, e.g., approximately 10 nm and approximately 50 nm. A top contact layer 350 is formed above electron blocking layer 340, and includes or consists essentially of one or more semiconductor materials, e.g., $Al_xGa_{1-x}N$, doped with at least one impurity such as Mg. Top contact layer 350 is doped either n-type or p-type, but with conductivity opposite that of bottom contact layer 310. The thickness of top contact layer 350 is, e.g., between approximately 50 nm and approximately 100 nm. Top contact layer 350 is capped with a cap layer 360, which includes or consists essentially of one or more semiconductor materials doped with the same conductivity as top contact layer 350. In an embodiment, cap layer 360 includes GaN doped with Mg, and has a thickness between approximately 10 nm and approximately 200 nm, preferably approximately 50 nm. In some embodiments, high-quality ohmic contacts may be made directly to top contact layer 350 and cap layer 360 is omitted. In other embodiments, top contact layer 350 and/or electron-blocking layer 340 are omitted and the top contact is formed directly on cap layer 360 (in such embodiments, cap layer 360 may be considered to be a "top contact layer"). While it is preferred that layers 310-340 are all pseudomorphic, top contact layer 350 and/or cap layer 360 may relax without introducing deleterious defects into the active layers below which would adversely affect the performance of PUVLED structure 300 (as described below with reference to FIG. 3B). Each of layers 310-350 is pseudomorphic, and each layer individually may have a thickness greater than its predicted critical thickness. Moreover, the collective layer structure including layers 310-350 may have a total thickness greater than the predicted critical thickness for the layers considered collectively (i.e., for a multiple-layer structure, the entire structure has a predicted critical thickness even when each individual layer would be less than a predicted critical thickness thereof considered in isolation).

Figure 3B:
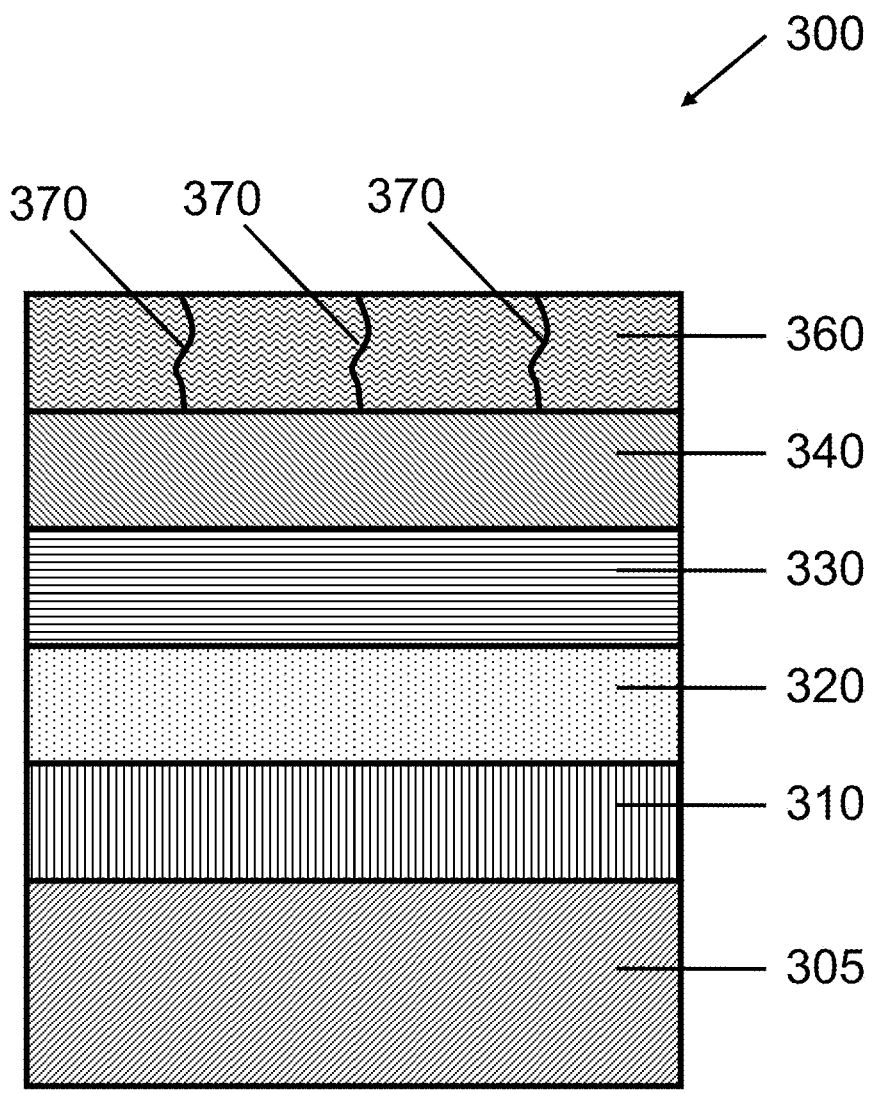

In various embodiments, layers 310-340 of PUVLED structure 300 are pseudomorphic, and cap layer 360 is intentionally relaxed. As shown in FIG. 3B, layers 310-340 are formed as described above with reference to FIG. 3A. Cap layer 360 is subsequently formed in a partially or substantially strain-relaxed state via judicious selection of its composition and/or the deposition conditions. For example, the lattice mismatch between cap layer 360 and substrate 305 and/or MQW layer 330 may be greater than approximately 1%, greater than approximately 2%, or even greater than approximately 3%. In a preferred embodiment, cap layer 360 includes or consists essentially of undoped or doped GaN, substrate 305 includes or consists essentially of AlN, and MQW layer 330 includes or consists essentially of multiple $Al_{0.55}Ga_{0.45}N$ quantum wells interleaved with $Al_{0.75}Ga_{0.25}N$ barrier layers, and cap layer 360 is lattice mismatched by approximately 2.4%. Cap layer 360 may be substantially relaxed, i.e., may have a lattice parameter approximately equal to its theoretical unstrained lattice constant. As shown, a partially or substantially relaxed cap layer 360 may contain strain-relieving dislocations 370 having segments threading to the surface of cap layer 360 (such dislocations may be termed "threading dislocations"). The threading dislocation density of a relaxed cap layer 360 may be larger than that of substrate 305 and/or layers 310-340 by, e.g., one, two, or three orders of magnitude, or even larger. Cap layer 360 is preferably not formed as a series of coalesced or uncoalesced islands, as such islanding may deleteriously impact the surface roughness of cap layer 360.

A graded layer may be formed between layers 310-340 and cap layer 360, and its composition at its interfaces with layers 340, 360 may substantially match the compositions of those layers. The thickness of this graded layer, which is preferably pseudomorphically strained, may range between approximately 10 nm and approximately 50 nm, e.g., approximately 30 nm. In some embodiments, epitaxial growth may be temporarily stopped between growth of the graded layer and cap layer 360.

In an exemplary embodiment, an electron-blocking layer 340 including or consisting essentially of $Al_{0.8}Ga_{0.2}N$ or $Al_{0.85}Ga_{0.15}N$ is formed over MQW layer 330. Prior to formation of cap layer 360 including or consisting essentially of GaN, a graded layer is formed over electron-blocking layer 340. The graded layer may be graded in composition from, for example, $Al_{0.85}Ga_{0.15}N$ to GaN over a thickness of approximately 30 nm. The graded layer may be formed by, e.g., MOCVD, and in this embodiment is formed by ramping the flow of TMA and TMG (by ramping the flow of hydrogen through their respective bubblers) from the conditions utilized to form electron-blocking layer 340 to 0 standard cubic centimeters per minute (sccm) and 6.4 sccm, respectively, over a period of approximately 24 minutes, thus resulting in a monotonic grade from $Al_{0.85}Ga_{0.15}N$ to GaN (all of the other growth conditions are substantially fixed). The thickness of the graded layer in this exemplary embodiment is approximately 30 nm, and a hole concentration of approximately $3 \times 10^{19}$ cm$^{-3}$ may be achieved through polarization doping without impurity doping (e.g., even being substantially free of doping impurities), as modeled using SiLENSe software. In general, polarization doping is enabled by the polarization in nitride materials that is due to the difference in electronegativity between the metal atoms and the nitrogen atoms. This results in a polarization field along asymmetric directions in the wurtzite crystal structure. In addition, strain in the layers may result in additional piezoelectric polarization fields and thus additional polarization doping. These fields create fixed charges at abrupt interfaces (e.g., two-dimensional sheets) or graded composition layers (e.g., three-dimensional volumes), which results in mobile carriers of the opposite sign. The magnitude of the total charge is defined by the difference in Al compositions within the graded layer, i.e., the difference between the starting composition and the final composition. The concentration of carriers is defined by the total charge divided by the graded layer thickness. A very high carrier concentration may be achieved by a high composition change over a small thickness, while a lower composition change or larger grading thickness typically results in a smaller carrier concentration; however, for a given composition change the total number of carriers is generally constant.

Figure 4A:
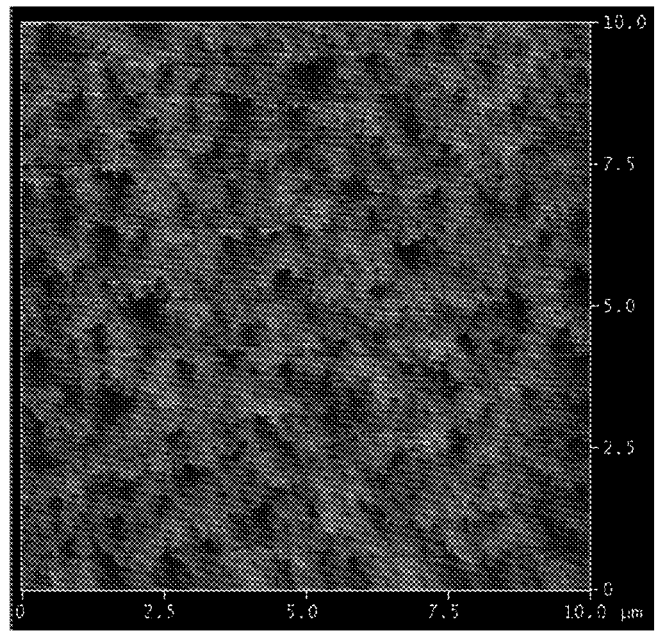
FIG. 4A is an atomic force microscopy scan of a capping layer for a light-emitting device in accordance with various embodiments of the invention.
Figure 4B:
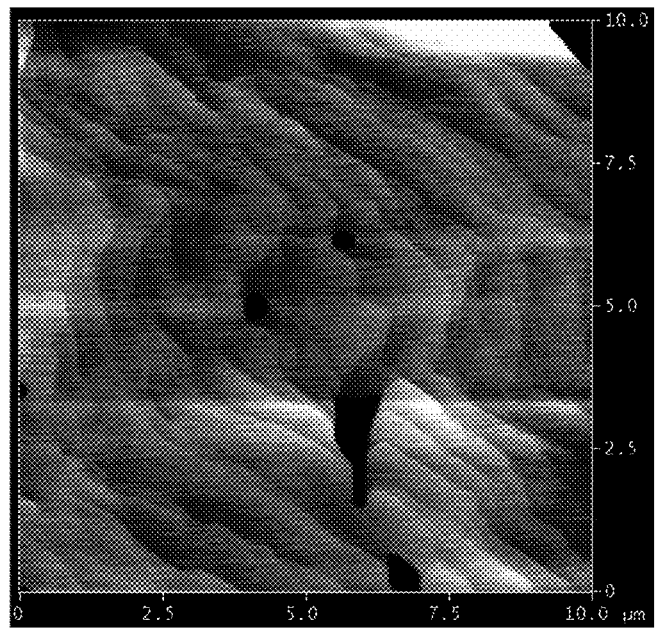
FIG. 4B is an atomic force microscopy scan of a conventional capping layer for a light-emitting device.

As detailed above, preferred embodiments of the present invention utilize very thin SPG layers in order to minimize absorption of UV photons therein. Such SPG layers preferably have thicknesses of less than 50 nm, e.g., between approximately 10 nm and approximately 30 nm. In an embodiment, smooth (25-50 nm) p-GaN layers were grown on a typical pseudomorphic LED structure (AlN/n-AlGaN/MQW/electron-blocking layer/p-GaN) by MOCVD and trimethylgallium (TMGa) and $NH_3$ were used as Ga and N precursors. Some conventional p-GaN layers are grown at 1000° C. and at a pressure of 100 Torr, and often these layers are rough, exhibiting an islanded or pyramidal morphology. Such approaches are encouraged by the conventional wisdom in the art, which indicates that one should enhance the mobility of the Ga adatom to promote lateral growth and coalescence of the layer. Thus, conventional wisdom teaches that contact-layer growth should use increased V/III ratios and higher temperatures. However, such techniques were unable to achieve smooth surfaces on the pseudomorphic layer in the thickness range utilized in embodiments of the present invention. Notably, the large strain in the pseudomorphic layer enhances island formation and increased surface roughness. Unexpectedly, in order to suppress such surface roughening, in accordance with embodiments of the present invention, growth temperatures of 850° C.-900° C. may be utilized for growth of the SPG layer, and growth pressures of 20 Torr may be utilized to enhance the adatom mobility at this lower growth-temperature regime. The growth rate of smooth p-GaN is only approximately 5 nm/min. The morphological and elemental properties of resulting SPG layers were investigated using atomic force microscopy (AFM) and secondary ion mass spectroscopy (SIMS). AFM shows smoother p-GaN layers (Rq value of approximately 0.85 nm) as shown in FIG. 4A, compared to the rougher morphology of conventional p-GaN (Rq value of approximately 7.2 nm) shown in FIG. 4B. Here, the actual island heights are over 50 nm and these thicker islands result in higher absorption and also leave areas uncovered by p-GaN which will result in poor p-contact by the contact metallization when these holes occur in the regions that are covered by the contact metallization. SIMS analysis shows higher doping concentration (by a factor of two) in the smooth p-GaN compared to the conventional p-GaN; however, the concentration is not constant and does not reach equilibrium until growth of ~25 nm of p-GaN, resulting in difficulties making ohmic contacts to layers thinner than 25 nm. In order to overcome this issue, a soak, i.e., exposure within the deposition chamber, (of, e.g., 1-10 minutes, for example 5 minutes) with only the dopant (e.g., Mg) source (i.e., no Ga source) flowing may be utilized to saturate the surface prior to growth initiation. For example, bis-cyclopentadienylmagnesium (Cp2Mg) may be utilized at an Mg source for the soak when MOCVD is being utilized for layer growth. The precursor may be disposed within a bubbler, and a carrier gas such as nitrogen or hydrogen may be flowed into the bubbler to form a gas solution saturated with the dopant precursor. This enables higher dopant concentration and good ohmic contact formation to layers as thin as 5 nm. In summary, very thin p-GaN layers (<10 nm) may be easily realized in this growth regime owing to the slower growth rate and the conformal morphology while the doping concentrations may be optimized by adjusting the input precursor flows.

Figure 5:
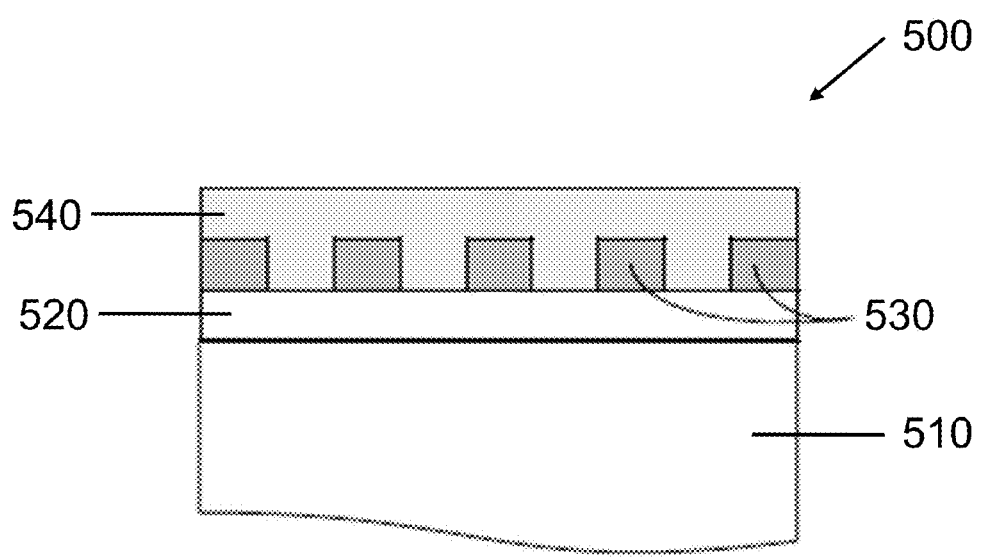
FIG. 5 is a schematic cross-section of a portion of a light-emitting device in accordance with various embodiments of the invention.

In an exemplary embodiment, polarization doping and a thin SPG layer are combined with a patterned reflector as shown in FIG. 5, which depicts a portion of a UV LED device 500. In device 500, region 510 includes or consists essentially of the AlN substrate and the active region of the device, for example as detailed above and illustrated in FIG. 3A. Region 510 is topped with a SPG layer 520, which is kept smooth to enable a very thin layer with high UV transparency. A contact layer 530, formed on the SPG layer 520, is typically substantially not UV reflective but forms a good ohmic contact to the SPG layer 520. In an exemplary embodiment, contact layer 530 includes or consists essentially of Ni/Au. As shown, the contact layer is, in preferred embodiments, patterned onto the surface of SPG layer 520. The spacing between individual portions of contact layer 530 may be defined via, e.g., conventional photolithography. The pattern may be in the form of lines or patterns of isolated "pixels" (or "islands") as shown in FIG. 5. Lines may have widths of, for example, 1 µm to 50 µm, e.g., 5 µm, and may have spacings therebetween of, for example 1 µm to 50 µm, e.g., 5 µm. Pixels may be, for example, substantially cubic or rectangular solids or may even be substantially hemispherical, and pixels may have a dimension such as width, length, or diameter of, for example, 1 µm to 50 µm, e.g., 5 µm. The contact area and the spacing are typically defined to optimize the wall plug efficiency of the device.

As shown in FIG. 5, the contact layer 530 may be capped with a reflector 540 formed both above the contact layer 530 (or isolated portions thereof) and between portions of the contact layer 530 (i.e., in direct contact with SPG layer 520). The reflector 540 typically includes or consists essentially of a metal (or metal alloy) that is highly reflective to UV light but that does not form a good ohmic contact to the SPG layer 520. For example, the reflector 540 may include or consist essentially of Al. The contact area of the contact layer 530 will generally determine, at least in part, the effective contact resistance of the combined contact layer 530 and reflector 540. For instance, if 10% of the area is covered by the contact layer 530, then the effective contact resistance is increased by a factor of ten. However, at the same time, the reflector area (i.e., the area of SPG layer 520 capped directly by reflector 540, without contact layer 530 therebetween) is increased. In an exemplary embodiment, the contact resistivity of the contact layer 530 is less than approximately 1.0 $m\Omega\text{-cm}^2$, or even less than approximately 0.5 $m\Omega\text{-cm}^2$. By using a 1:10 ratio of contact 530 area to reflector 540 area, the effective contact resistance is increased to 5 $m\Omega$ and the effective (averaged over all area) reflector is reduced by 10% (e.g., a 90% reflectivity of the reflector 540 is effectively reduced to 81%). In addition, the size of individual metal contact pixels of contact layer 530 is preferably kept as small as possible so that current spreading from the individual contact pixels occurs. This increases the probability that the generated photons will strike the reflector 540 rather than the contact pixel of contact layer 530 (which would typically occur if the current traveled straight down from the contact metal pixel of contact layer 530). The polarization-doped AlGaN enables current spreading while maintaining transparency even with a thin SPG layer 520; the thin SPG layer 520 is used primarily to lower the contact resistance while maintaining low absorption. This is in direct contrast to conventional methods where p-doping in high Al content $Al_xGa_{1-x}N$ is highly resistive and will not allow current spreading.

Embodiments of the invention may utilize photon-extraction techniques described in the '093 application. Such techniques include surface treatment (e.g., roughening, texturing, and/or patterning), substrate thinning, substrate removal, and/or the use of rigid lenses with thin intermediate encapsulant layers. Exemplary substrate-removal techniques include laser lift-off, as described in "High brightness LEDs for general lighting applications using the new Thin GaN™—Technology", V. Haerle, et al., Phys. Stat. Sol. (a) 201, 2736 (2004), the entire disclosure of which is incorporated by reference herein.

In embodiments in which the device substrate is thinned or removed, the back surface of the substrate may be ground, for example, with a 600 to 1800 grit wheel. The removal rate of this step may be purposefully maintained at a low level (approximately 0.3-0.4 μm/s) in order to avoid damaging the substrate or the device layers thereover. After the optional grinding step, the back surface may be polished with a polishing slurry, e.g., a solution of equal parts of distilled water and a commercial colloidal suspension of silica in a buffered solution of KOH and water. The removal rate of this step may vary between approximately 10 μm/min and approximately 15 μm/min. The substrate may be thinned down to a thickness of approximately 200 μm to approximately 250 μm, or even to a thickness of approximately 20 μm to approximately 50 μm, although the scope of the invention is not limited by this range. In other embodiments, the substrate is thinned to approximately 20 μm or less, or even substantially completely removed. The thinning step is preferably followed by wafer cleaning in, e.g., one or more organic solvents. In one embodiment of the invention, the cleaning step includes immersion of the substrate in boiling acetone for approximately 10 minutes, followed by immersion in boiling methanol for approximately 10 minutes.

Structures fabricated utilizing the above-described techniques in accordance with various embodiments of the present invention have been fabricated with three different reflector metal areas, 0%, 51%, and 60%. No significant forward voltage increase was observed at 51% reflector metal area with only 0.1 V increase at 100 mA (while a 0.4 V increase was seen at 60% reflector metal area), and an improvement in extraction efficiency of 24% was measured for devices emitting through a thick absorbing AlN substrate with 51% reflector metal area. However, when combined with die thinning, roughening, and encapsulation an overall gain of ~100% was achieved for devices with 51% reflector metal area compared to devices with 0% reflector area. The results from 60% reflector area were improved less than 51%, but optimization of both contact metal spacing and reflector area may result in further gains in overall efficiency.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An ultraviolet (UV) light-emitting device comprising:
    a substrate having an $Al_yGa_{1-y}N$ top surface, wherein $1.0 \geq y \geq 0.4$;
    a light-emitting device structure disposed over the substrate, the device structure comprising a plurality of layers each comprising $Al_xGa_{1-x}N$;
    an undoped graded $Al_{1-z}Ga_zN$ layer disposed over the device structure, a composition of the graded layer being graded in Ga concentration z such that the Ga concentration z increases in a direction away from the light-emitting device structure;
    a p-doped $Al_{1-w}Ga_wN$ cap layer disposed over the graded layer, the p-doped $Al_{1-w}Ga_wN$ cap layer having a Ga concentration w, wherein $1.0 \geq w \geq 0.8$; and
    a metallic contact disposed over the $Al_{1-w}Ga_wN$ cap layer and comprising at least one metal.

2. The light-emitting device of claim 1, wherein the $Al_{1-w}Ga_wN$ cap layer is doped with Mg.

3. The light-emitting device of claim 1, wherein the $Al_{1-w}Ga_wN$ cap layer is at least partially relaxed.

4. The light-emitting device of claim 1, wherein the light-emitting device has a photon extraction efficiency of greater than 25%.

5. The light-emitting device of claim 1, wherein the graded layer and $Al_{1-w}Ga_wN$ cap layer collectively absorb less than 80% of UV photons generated by the light-emitting device structure and having a wavelength less than 340 nm.

6. The light-emitting device of claim 1, wherein the at least one metal of the metallic contact comprises Ni/Au or Pd.

7. The light-emitting device of claim 1, wherein the metallic contact has a reflectivity to light generated by the light-emitting device structure of approximately 60% or less.

8. The light-emitting device of claim 1, wherein the metallic contact has a reflectivity to light generated by the light-emitting device structure of approximately 30% or less.

9. The light-emitting device of claim 1, wherein the metallic contact has the form of a plurality of discrete lines and/or pixels of the at least one metal, portions of the $Al_{1-w}Ga_wN$ cap layer not being covered by the metallic contact.

10. The light-emitting device of claim 9, further comprising a reflector disposed over the metallic contact and the uncovered portions of the $Al_{1-w}Ga_wN$ cap layer.

11. The light-emitting device of claim 10, wherein the reflector comprises a metal having greater than 90% reflectivity to UV light and a work function less than approximately 4.5 eV.

12. The light-emitting device of claim 10, wherein the reflector has a contact resistivity to the $Al_{1-w}Ga_wN$ cap layer of greater than approximately 5 mΩ-cm².

13. The light-emitting device of claim 10, wherein the reflector has a contact resistivity to the $Al_{1-w}Ga_wN$ cap layer of greater than approximately 10 mΩ-cm².

14. The light-emitting device of claim 10, wherein the reflector comprises Al.

15. The light-emitting device of claim 1, wherein the light-emitting device comprises a light-emitting diode.

16. The light-emitting device of claim 1, wherein a bottom portion of the graded layer proximate the active device structure has a Ga concentration z substantially equal to a Ga concentration of a layer directly thereunder.

17. The light-emitting device of claim 1, wherein the substrate consists essentially of doped or undoped AlN.

18. The light-emitting device of claim 1, wherein the $Al_{1-w}Ga_wN$ cap layer has a thickness between approximately 2 nm and approximately 30 nm.

19. The light-emitting device of claim 1, wherein the $Al_{1-w}Ga_wN$ cap layer has a surface roughness of less than approximately 6 nm over a sample size of approximately 200 μm×300 μm.

20. The light-emitting device of claim 1, wherein the metallic contact has a contact resistivity to the $Al_{1-w}Ga_wN$ cap layer of less than approximately 1.0 mΩ-cm².

21. The light-emitting device of claim 1, wherein a top portion of the graded layer has a Ga concentration z of approximately 1.

22. The light-emitting device of claim 1, wherein the Ga concentration w of the p-doped $Al_{1-w}Ga_wN$ cap layer is approximately 1.

23. The light-emitting device of claim 1, wherein the substrate comprises a substrate material and a $Al_yGa_{1-y}N$ material disposed thereover.

24. The light-emitting device of claim 23, wherein the substrate material comprises at least one of silicon carbide, silicon, or sapphire.

25. The light-emitting device of claim 23, wherein the $Al_yGa_{1-y}N$ material is substantially fully lattice relaxed.

26. The light-emitting device of claim 23, wherein the $Al_yGa_{1-y}N$ material has a thickness of at least 1 μm.

27. The light-emitting device of claim 1, wherein the light-emitting device is a laser.

28. The light-emitting device of claim 1, wherein a threading dislocation density of at least one of the $Al_{1-w}Ga_wN$ cap layer or the light-emitting device structure is less than $10^5$ cm⁻².

29. The light-emitting device of claim 1, wherein the graded layer has a thickness between approximately 10 nm and approximately 50 nm.

\* \* \* \* \*